US006773501B2

(12) United States Patent
Kerdoncuff et al.

(10) Patent No.: US 6,773,501 B2
(45) Date of Patent: Aug. 10, 2004

(54) METHOD OF MAKING A <250 NM WAVELENGTH OPTICAL FLUORIDE CRYSTAL AND DEVICE

(75) Inventors: Alain Kerdoncuff, Vincennes (FR); Alexandre M. Mayolet, Auneau (FR)

(73) Assignee: Corning Incorporated, Corning, NY (US)

( * ) Notice: Subject to any disclaimer, the term of this patent is extended or adjusted under 35 U.S.C. 154(b) by 25 days.

(21) Appl. No.: 10/229,238

(22) Filed: Aug. 26, 2002

(65) Prior Publication Data

US 2003/0044651 A1 Mar. 6, 2003

(30) Foreign Application Priority Data

Aug. 27, 2001 (FR) .............................................. 01 11122

(51) Int. Cl.[7] ................................................ C30B 1/00
(52) U.S. Cl. .............................. 117/2; 117/13; 117/200
(58) Field of Search ................................ 117/2, 13, 200

(56) References Cited

U.S. PATENT DOCUMENTS 6,153,011 A   11/2000   Pandelisev et al. ......... 117/200
6,238,479 B1   5/2001   Oba ............................ 117/68

FOREIGN PATENT DOCUMENTS

WO    WO 00/75697 A1   12/2000

*Primary Examiner*—Felisa Hiteshew
(74) *Attorney, Agent, or Firm*—Walter M. Douglas; Edward F. Murphy

(57) ABSTRACT

The optical fluoride crystal treatment device of the invention includes a enclosure (12) separating the device from its external environment, heating means to heat and keep the internal volume (16) of said enclosure (12) at a predetermined temperature, at least one hollow platform (20) delimiting an internal chamber (22) whose upper wall (24) bears at least two independent diffusers (30) each delimiting a cavity (32) able to receive a unitary quantity (100) of said optical fluoride crystal substance, each of said cavities (32) communicating with said internal chamber (22) of the corresponding platform (20), a gas supply source containing said reactive gas, and means (50, 52, 54) for distributing said gas containing said reactive gas from said supply source to the inside of the internal chamber of each platform and having means (44) for regulating the pressure of said distributed gas. This optical fluoride crystal treatment device is preferably used to carry out anionic purification with a reactive gas formed of a fluoridation gas, a fluoride powder of an alkaline metal or alkaline-earth metal in the making of optical fluoride crystals.

24 Claims, 2 Drawing Sheets

METHOD OF MAKING A <250 NM WAVELENGTH OPTICAL FLUORIDE CRYSTAL AND DEVICE

BACKGROUND OF THE INVENTION

Field of the Invention

The present invention relates generally to UV <250 nm transmitting optical fluoride crystals and purified fluoride substances therefor, and particularly to making high quality calcium fluoride optical fluoride crystals for lithography/laser elements with excellent optical qualities for below 250 nm wavelengths utilized in semiconductor circuitry advanced optical microlithography systems.

The burden of the demands for improved performance of computers falls on the lithographic process used to fabricate the integrated circuit chips. Lithography involves irradiating a mask and focusing the pattern of this mask through an optical microlithography system onto a wafer coated with a photoresist. The pattern on the mask is thereby transferred onto the wafer. Decreasing the line-widths of the features on a given wafer brings about advances in performance. The enhanced resolution required to achieve finer line-widths is enabled by decreasing the wavelength of the illumination source. The energies used in lithographic patterning are moving deeper into the UV region. Optical components capable of reliable performance at these short optical microlithography wavelengths are required. Few materials are known that have a high transmittance at 193 nm and 157 nm and do not deteriorate under intense laser exposure. Fluoride crystals such as calcium fluoride and barium fluoride are potential materials with high transmittance at wavelengths <250 nm. Projection optical photolithography systems that utilize the vacuum ultraviolet wavelengths of light at and below 193 nm provide desirable benefits in terms of achieving smaller feature dimensions. Microlithography systems that utilize vacuum ultraviolet wavelengths in the 157 nm wavelength region have the potential of improving integrated circuits and their manufacture. The commercial use and adoption of 193 nm and below vacuum ultraviolet wavelengths such as 157 nm has been hindered by the transmission nature of such deep ultraviolet wavelengths in the 157 nm region through optical materials. Such slow progression by the semiconductor industry of the use of VUV light below 175 nm such as the 157 nm region light has been also due to the lack of economically manufacturable blanks from optically transmissive materials and difficulties in manufacturing blanks which can be identified as high quality and qualified for their intended microlithography optical element and laser use. For the benefit of deep ultraviolet photolithography in the VUV 157 nm region such as the emission spectrum of the fluorine excimer laser to be utilized in the manufacturing of integrated circuits there is a need for below 250 nm wavelength transmitting optical fluoride crystals that have beneficial high purity and optical and highly qualified properties including good transmission preferably below 200 nm and at 193 nm and 157 nm and that can be manufactured reliably and economically in high purity. The present invention overcomes problems in the prior art and provides a means for economically providing high quality very low contaminant level below 250 nm wavelength transmitting optical fluoride crystals that can be used to improve the manufacturing of integrated circuits with vacuum ultraviolet wavelengths. The invention provides for high purity high quality calcium fluoride optical fluoride crystal lithography and excimer laser elements with very low contaminant level concentrations.

SUMMARY OF THE INVENTION

Figure 1:
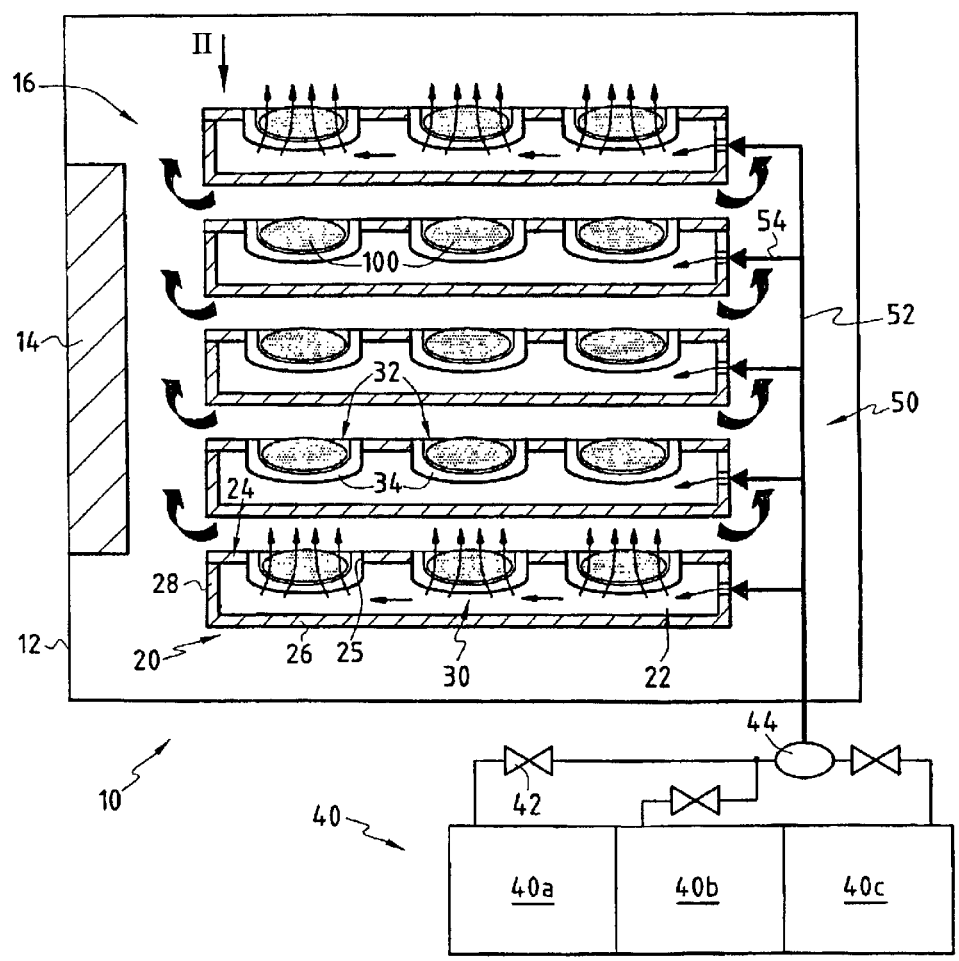
FIG. 1 shows an embodiment of the invention.

The present invention concerns the treatment of a fluoride crystal substance in the form of a powder by means of gas film levitation. More specifically, it concerns:
- an original device for treating a substance in the form of a fluoride powder by gas film levitation, and
- a method for treating a fluoride substance in the form of a powder by gas film levitation which, when implemented, uses said device.

In particular but not exclusively, the present invention concerns the treatment of a fluoride powder and more particularly the anionic purification of this powder with the aid of a reactive gas including a fluorinating gas.

In one preferred, but not exclusive, application, the present invention concerns the treatment of a fluoride powder of an alkaline metal or alkaline-earth metal, or a powder of mixed combinations of the latter or a mixture of these powders.

Fluoride monocrystals of alkaline metals (such as NaF, KF or LiF) or fluorides of alkaline-earth metals (such as $CaF_2$, $BaF_2$, $MgF_2$ or $SrF_2$) or mixed combinations of these (such as formulation combinations $(M1)_x(M2)_{1-x}F_2$ in which M1 can be selected from Ca, Ba or Sr, and M2 can be selected from Ba, Ca or Sr and x is such that $0 \leq x \leq 1$ or even $Ca_{1-x-y}Ba_xSr_yF_2$ formulation combinations in which x and y are such that $0 \leq x \leq 1$ and $0=y=1$ or even $MRF_3$ formulation combinations in which M can be selected from Li, Na or K and R can be selected from Ca, Sr, Ba or Mg) are required in increasingly pure forms for applications of various types.

Thus, the calcium fluoride monocrystals ($CaF_2$) are sought-after with optimal transmission characteristics for producing lenses used in lithography with operational wavelengths of 193 nm and 157 nm. Similarly, it has been recommended to use 157 nm of extremely pure barium fluoride for the chromatic correction of lithographic microsystems. $MgF_2$ is used for creating visible ultraviolet windows, and LiF for creating small laser windows.

In any event, a search is under way to obtain extremely pure fluoride crystal optical elements to reach optimal transmissions.

The raw materials (fluorides of alkaline or alkaline-earth metals or combinations of the two) are available on the market with cationic contamination rates of the order of ppm. As regards anionic contamination, its rates are generally higher: about or greater than 100 ppm. Said anionic contamination of this type of materials (fluorides of alkaline metals or alkaline-earth metals) is basically due to the oxygenic species. It is highly prejudicial. $CaF_2$ and $BaF_2$, when they contain oxygen, have an extremely low transmission in the visible and ultraviolet spectrums.

In conventional methods for producing monocrystals (according to the Stockbarger technique), solid compounds are introduced, such as $PbF_2$, $CdF_2$, or $ZnF_2$ to neutralise present oxygenic species originating from the introduced raw material and/or the reactional environment (inside of a crystallisation oven, whose graphite walls are still likely to have absorbed air). $PbF_2$ is the compound called a fluorinating agent most frequently used to date to the extent that its handling does not bring up any particular difficulty where it is solid at ambient temperature and where it and its corresponding oxide (PbO) exhibit high steam pressure at the working temperatures of crystallisation ovens. Said $PbF_2$ acts during the preparation of $CaF_2$ crystals according in particular to the following reaction: $CaO+PbF_2 \rightarrow CaF_2+PbO$.

However, the introduction of $PbF_2$ and its homologues, if it is beneficial with regard to the nuisance of the oxygenic species, is moreover prejudicial. In fact, there are still traces of said solid compounds in the crystal, this consequently affecting transmission of said crystal and the homogeneity of its refraction coefficient.

The aim of the present invention is to mitigate the drawbacks of these techniques of the prior art by offering a device and method for treating a substance in the form of a powder by using gas reagents instead of said solid compounds.

The invention will be better understood and other advantages and features will appear more clearly upon reading the explanatory description which follows and which is made with reference to the annexed Figures.

DETAILED DESCRIPTION OF THE INVENTION

The optical quality of a single crystal is strongly affected by the presence of contaminants in its crystalline structure.

The present invention thus concerns a device for treating a substance in the form of a powder by levitation onto a gas film containing a reactive gas.

Characteristically, the device of the invention includes a enclosure separating the device from its external environment, heating means to heat and keep at a predetermined temperature the internal volume of said enclosure, at least one hollow platform delimiting an internal chamber whose upper wall bears at least two independent diffusers each delimiting a cavity able to receive a unitary quantity of said substance, said diffusers being made of a material permeable to the gases so that each of said cavities communicates with said internal chamber of the corresponding platform, a gas supply source containing said reactive gas, and means for distributing said gas containing said reactive gas from said supply source to the inside of the internal chamber of each platform and which possess means for regulating the pressure of said distributed gas.

Thus, it is possible to treat at the same time a quantity of powder, which may be considerable and which is formed from a batch of several unitary quantities of said powder, each powder unitary quantity being supported via levitation with the aid of a gas film able to react optimally with this unitary quantity owing to the maximum contact surface. In addition, this arrangement makes it possible to preserve uniform operational conditions, especially as regards the temperature inside the enclosure, the flow rate, the pressure and the reactive gas concentration of the gas feeding the internal chamber of each platform.

The powder, by virtue of its divided state, offers a large reactional surface (1 $m^3$ of particles with an average equivalent diameter of 100 $\mu m$ covers a surface of about 30,000 $m^2$). According to the invention, this large reactional surface is perfectly and fully placed in contact with the reactive gas by means of the simultaneously treating unitary quantities of the gas forming all the powder.

The gas of the film supports each powder unitary quantity.

It ought to be mentioned that said powder needs to remain in a divided powder state. Thus, it is essential to operate as indicated earlier at a temperature lower than the melting temperature of the treated substance.

The following arrangements are preferably adopted, either independently or combined:

each platform comprises at least four diffusers and preferably at least six, or even preferably between eight and fifty, each cavity is able to receive between 100 and 200 g of said substance, and each diffuser is made of a porous material possessing permeability between 0.1 and 15 $cm^2/s$, said porous material preferably belonging to the group constituted by graphite, aluminium, ceramics and porous metals.

According to one embodiment variant, the device comprises at least two platforms with one on top of the other, each platform being connected to independent distribution means. Thus, the treatment is carried out in a enclosure having a limited internal volume and a controlled atmosphere in parallel with a large number of unitary powder quantities and thus a large volume of powder. The capacity of the device may thus vary over a wide range.

According to another characteristic, the present invention concerns a method for treating a substance in the form of a powder using said device of said type.

Generally speaking, the treatment method of the present invention makes it possible to prepare an optical fluoride crystal by implementing the following stages:

treatment of said fluoride substance in the form of a powder using said device of said type so as to obtain a treated fluoride powder;

melting of said treated fluoride powder in an optical fluoride crystal growth crucible, and the growth of the optical fluoride crystal by cooling said treated powder melted in said optical fluoride crystal growth crucible.

In particular, the treatment method of the present invention is applied to a substance constituted by a fluoride powder of an alkaline metal (such as sodium fluoride NaF, potassium fluoride KF or lithium fluoride LiF) or a fluoride powder of an alkaline-earth metal (such as calcium fluoride $CaF_2$, barium fluoride $BaF_2$, magnesium fluoride $MgF_2$, or strontium fluoride $SrF_2$), or a fluoride powder made up of mixed combinations of said materials (such as formulation combinations $(M1)_x(M2)_{1-x}F_2$ in which M1 can be selected from Ca, Ba, or Sr, and M2 can be selected from Ba, Ca or Sr and x is such that 0=x=1 or 0=y=1 or even formulation combinations $MRF_3$ in which M can be selected from Li, Na or K, and R can be selected from Ca, Sr, Ba or Mg) or a powder of a mixture of said substances.

The powders treated according to the invention clearly exhibit size grading compatible with their levitation. These are generally grains whose average equivalent diameter is between 10 and 500 $\mu m$. Advantageously, these are basically grains of a hundred or several hundred of microns.

The gas containing the reactive gas and providing mechanical support via levitation of the powder consists of that either said "pure" reactive gas or said diluted reactive gas (at a given concentration) in another gas, preferably inert. It is clear that the dilution gas does not pollute (oxidize) the substance currently being treated. It is recommended, without it being restrictive, to introduce argon, helium, neon, xenon, nitrogen or indeed a mixture of these inert gases.

When the treated powder is a fluoride powder of an alkaline metal or alkaline-earth metal or their mixtures and when the treatment is an anionic purification (in relation to oxygenic species), the reactive gas introducing alone or mixed with at least one other gas, preferably inert, is generally a fluorinating gas. It is advantageously selected from $BF_3$, $F_2$, $NF_3$, $SF_6$, $CF_4$ and their mixtures. The introduction of other fluorinating gases, such as $CHF_3$ and $CH_2F_2$, is however not excluded. In any event, it is preferable to introduce the fluorinating gases listed above and in particular introducing $F_2$, $NF_3$, $SF_6$ and $CF_4$ and by far that of the introduction of $CF_4$, a non-toxic gas, able to be used at 100° C. and at temperatures of more than 100° C.

In said case, it is preferable, by implementing the method of the invention involving an anionic purification like treatment of the substance, to end up having a treated optical fluoride crystal substance preferably containing less than 50 ppm of oxygen in weight (preferably less than 40 ppm, less than 30 ppm, less than 20 ppm or even less than 10 ppm of oxygen in weight) and less than 10 ppm of metal contaminants in weight, in particular Zn, Cd, Pb, Na, K, Mn and Fe (preferably less than 1 ppm of metal contaminants in weight).

In said case, the anionic purification carried out without contact with the diffuser (forming a crucible) containing a unitary quantity of powder avoids any cationic contamination of the substance.

The implementation of the method of the invention makes it possible to prepare an optical fluoride (mono)crystal for use in applications in optical systems functioning on a wavelength smaller than 250 nm, this preparation method successively including:

the successive implementation of a stage for the anionic purification of said substance in the form of a fluoride powder according to the method of the invention so as to obtain a purified optical fluoride crystal powder;

the melting of said purified optical fluoride crystal powder in an optical fluoride crystal growth crucible, and the growth of the optical fluoride crystal by cooling of said purified fluoride powder melted in said crystal growth crucible.

According to an embodiment variant of the method, the latter successively comprises a treatment stage and melting stage for treating and melting a optical fluoride crystal substance in the form of a powder, said treatment stage being constituted by said method and said melting stage being started after the distribution means, which continue to be fed, preferably gradually move from said gas supply source containing the reactive gas for implementing the treatment to a supply source of another gas, possibly non-reactive, and after activating heating means to heat and keep at a temperature exceeding or equal to the melting temperature of said substance said internal volume of the enclosure.

In the case of said embodiment variant of the method of the invention, it is possible to use this method either for the preparation of a fluoride (mono)crystal intended for applications in optical systems functioning on a wavelength smaller than 250 nm, which successively includes:

the successive implementation of a stage for the anionic purification of said optical fluoride crystal substance in the form of a powder followed by a melting stage according to said aforementioned embodiment variant of the method of the invention so as to obtain a compacted purified optical fluoride crystal powder;

the melting of said compacted purified fluoride powder in an optical fluoride crystal growth crucible, and the growth of the optical fluoride crystal by cooling of said compacted purified fluoride powder melted in said crystal growth crucible.

Also, in the case of said embodiment variant of the method of the invention, it is possible to use this method, either to produce optical fluoride (mono)crystals for applications in optical systems functioning on a wavelength of less than 250 nm, or for the raw material or feedstock production intended for the production of optical fluoride (mono)crystals for applications in optical systems functioning on a wavelength of less than 250 nm in which the melting stage results in obtaining a raw material or feedstock formed of compacted powder having a density of more than 60% of the theoretical density of the optical fluoride monocrystal.

In the last case mentioned above, by using the method of the invention, this results in preferably obtaining an optical fluoride crystal raw material or optical fluoride crystal feedstock containing less than 50 ppm of oxygen in weight (preferably less than 40 ppm, less than 30 ppm, less than 20 ppm or even less than 10 ppm of oxygen in weight) and less than 10 ppm of metal contaminants in weight, especially Zn, Cd, Pb, Na, K, Mn and Fe (preferably less than 1 ppm of metal contaminants in weight).

According to another characteristic, the present invention concerns a method for preparing a optical fluoride (mono) crystal from a powder of an alkaline metal fluoride or from a powder of an alkaline-earth metal fluoride which successively includes:

the anionic purification of said fluoride powder according to said treatment method in which said reactive gas is selected from $BF_3$, $F_2$, $NF_3$, $SF_6$, $CF_4$ and their mixtures;

the melting of said purified fluoride powder, and the growth of the optical fluoride crystal by cooling of said melted purified fluoride powder.

According to another characteristic of the method of the invention, by implementing this method, this preferably results in obtaining a (mono)crystal whose ppm is less than 30 ppm, less than 20 ppm or even less than 10 ppm of oxygen in weight and less than 10 ppm of metal contaminants in weight (preferably less than 1 ppm of metal contaminants in weight), in particular from Zn, Cd, Pb, Na, K, Mn and Fe. This (mono)crystal preferably has an optical transmission of more than 85% per cm and preferably more than 95% per cm for wavelengths smaller than 164 nm and in particular for the wavelength of 157 nm.

Figure 2:
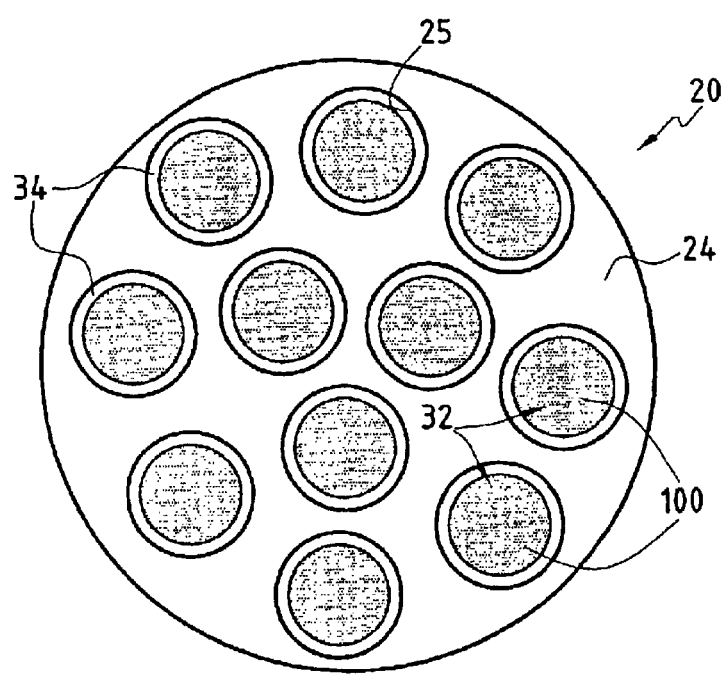
FIG. 2 shows an embodiment of the invention.

The invention and its secondary characteristics and their advantages shall be more readily understood on reading of the following non-restrictive description of an embodiment of the device of the invention given below by way of non-restrictive example with reference to the accompanying drawings on which FIG. 1 diagrammatically represents the device of the invention seen from the side, and FIG. 2 is a partial view along the direction II—II of FIG. 1 representing a platform seen from the top.

An example of the device to implement the treatment method of the invention is shown on FIG. 1 under the reference sign 10. This device 10 is made up of a enclosure 12 fitted with heating means 14 to heat and keep at a predetermined temperature the internal volume 16 of said enclosure. This enclosure 12 is traditionally constituted by an oven.

Placed in this enclosure is a stacking of hollow platforms 20. Each hollow platform 20 has an internal chamber 22 delimited by an upper wall 24, a lower wall 26 and a side wall 28. As shown on FIG. 1, the lower wall 26 and upper wall 28 are preferably horizontal and parallel to each other. The side wall 28 is vertical and forms a cylinder whose horizontal section can have varied shapes, such as circular as in the case shown.

FIG. 1 shows five superimposed platforms 20, but it is possible to have a different number, namely less or more, of platforms 20, a single platform also able to be used.

The upper wall 24 of each platform 20 bears at least two independent diffusers 30 each delimiting a cavity 32 able to receive a unitary quantity 100 of a substance in the form of a powder (between about 100 and 200 g). To this effect, the upper wall 24 of each platform 20 comprises openings 25 to each receive one diffuser 30.

Each diffuser 30 is therefore formed of a concave wall 34 made of a material permeable to the gases so that each of said cavities 32 communicates with said internal chamber 22 of the corresponding platform 20. In particular, a porous material is provided having permeability of between 0.1 and 15 cm$^2$/s. In particular, it is possible to use dense graphite or porous aluminium. The thickness of this wall 34 is several millimetres.

As shown on FIG. 2, each platform 20 comprises a series of eleven circular diffusers 30 distributed on the upper wall 24. A different number of diffusers 30, namely more or less can be used without modifying the functioning of the device 10.

FIG. 1 shows a gas supply source 40 constituted by three gas tanks 40a, 40b, 40c at the outlet of which a tap 42 is provided, said tap being connected to a circuit ending at a pump 44 constituting means for adjusting the pressure of said gas.

Thus, each tank 40a, 40b, 40c may contain a different gas possibly forming a reactive gas and it is then possible to establish a mixture between these gases by adjusting the flow rate of each tank 40a, 40b, 40c with the aid of taps 42. It is possible to use a different number of tanks, namely more or less than three and at least one.

The pump 44 makes it possible to adjust the pressure of the gas (or of the gas mixture) penetrating into the enclosure 12: downstream of the pump 44 is a circuit 50 for feeding with gas each platform 20 forming means for distributing said gas containing said reactive gas from said supply source 40 to the inside of the internal chamber 22 of each platform 20.

To this effect, a main pipe 52 extends from the pump 44, penetrates into the enclosure 12 and extends along the platforms 20. This main pipe is connected to each platform 20 at the level of a branching point to a secondary pipe 54 which opens into the internal chamber 22 of the corresponding platform 20.

Thus, the gas containing the reactive gas arrives under pressure (for example under a pressure of 1 to several bars with a flowrate of about 5 l/mn per diffuser for a diffuser having a diameter of between 50 and 100 mm) in the internal chamber 22 of each platform 20 and thus has to traverse the wall 34 of the diffusers 30. Thus results in creating a gas levitation film under the unitary quantity 100 of powder contained in each cavity 32. In this way, the flow of gas ensures mechanical support without being in contact with the powder and also ensures implementation of the chemical reaction between the powder and the gas and thus treatment of the powder.

As a result, the diffusers 30 form a number of reactors for individually treating each unitary powder quantity 100.

Having regard to the extremely high head loss in the porous material constituting the wall 34 of each diffuser, all the diffusers 30 of a given platform 20 and of all the platforms 20 receive an identical gas pressure.

After passing inside the diffusers, the gas diffuses into the entire internal volume 16 of the enclosure 12 (see the arrows on the sides of the platforms 20 on FIG. 1), this enclosure 12 thus forming an oven with a controlled atmosphere.

The material constituting the wall of the diffusers is clearly compatible with the powder and the reactive gas involved. It also has to resist the temperatures implementing the purification reaction, said temperatures generally being between 100 and 1400° C. Said reaction temperature is fixed case by case by clearly taking account of the nature of the reactive gas introduced and its reactivity. It ought to be mentioned here that said reaction temperature must strictly remain lower than the melting temperature of the material (for example the fluoride) constituting the powder involved.

By means of this platforms arrangement, the capacity of the device can vary over a wide range.

The treating method and in particular the anionic purification method of the invention is in fact particularly advantageous in that its implementation on various scales (laboratory scale, pilot scale, industrial scale) does not bring up any special difficulty. The treatment method and in particular the anionic purification method of the invention can in fact also be used both on several kilograms of powder and on one ton of said powder.

Thus, it can be understood that the device previously described makes it possible to implement the method of the invention by avoiding any contamination of the treated powder and its effectiveness is reliable when the reactive gas/powder contact is optimised and can be easily exploited on a large and small scale.

Said treatment method of the invention generates purified substance batches able to be treated—by melting and cooling—so as to obtain optical fluoride (mono)crystals.

In order to achieve this, said batches can be directly melted in the diffusers after stopping the supply of the reactive gas whilst maintaining a non-reactive gas film or can be transferred into another reactor to be melted.

The present invention is fully adapted for preparing an optical fluoride (mono)crystal from a substance constituted by a fluoride powder of an alkaline metal (such as sodium fluoride NaF, potassium fluoride KF or lithium fluoride LiF) or from a fluoride powder of an alkaline-earth metal (such as calcium fluoride $CaF_2$, barium fluoride $BaF_2$, magnesium fluoride $MgF_2$ or strontium fluoride $SrF_2$) or from a powder of mixed combinations of said materials (such as formulation combinations $(M1)_x(M2)_{1-x}F_2$ in which M1 can be selected from Ca, Ba or Sr, and M2 can be selected from Ba, Ca or Sr and x being such that 0=x=1 or even formulation combinations $Ca_{1-x-y}Ba_xSr_yF_2$ in which x and y are such that 0=x=1 and 0=y=1 or even formulation combinations $MRF_3$ in which M can be selected from Li, Na or K, and R can be selected from Ca, Sr, Ba or Mg) or from a powder of their mixtures by carrying out an anionic purification stage with the aid of a fluorinating gas.

These crystals are obtained with a low rate of contamination (especially oxygen, lead and cationic and anionic contaminants) and thus possess excellent transmission in the visible and ultraviolet spectrums below 200 nm.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. An optical fluoride crystal treatment process of a optical fluoride crystal substance in the form of a powder by gas film levitation, said gas containing a reactive gas, said process comprising
    (a) using a device having:
        an enclosure separating said device from its outside environment, a heating means for bringing and maintaining the internal volume of said enclosure to a treatment/purification temperature in the range of 100–1400° C., at least a hollow platform delimiting an internal chamber the top wall of which bears at least two independent diffusers, each diffuser delimiting a cavity able to receive a unitary quantity of said substance, said diffusers being manufactured in a gas permeable material so that each of said cavities communicates with said internal chamber of the corresponding platform, a supply source of a gas containing said reactive gas, and distribution means of said gas containing said reactive gas from said supply source to the inside of the internal chamber of each platform and which has regulating means of the pressure of said distributed gas;

wherein the treatment/purification temperature is below the melting point of the powder; and (b) placing said powder within said cavity delimited by each diffuser, and (c) treating said powder within said cavity at a treatment/purification temperature in the range of 100–1400° C. to form a purified powder by gas film levitation using said reactive gas.

2. An optical fluoride crystal treatment process according to claim 1, characterized in that said substance is a powder of an alkaline metal fluoride or a powder of an alkaline earth metal fluoride or a powder of a mixed combinations of aforementioned substances or a powder of their mixtures.

3. An optical fluoride crystal treatment process according to claim 2, characterized in that said treatment is an anionic purification and in that said reactive gas is a fluorinating gas.

4. An optical fluoride crystal treatment process according to claim 3, characterized in that said reactive gas is chosen among $BF_3$, $F_2$, $NF_3$, $SF_6$, $CF_4$ and their mixtures.

5. An optical fluoride crystal treatment process according to claim 3, characterized in that said anionic purification leads to a substance wherein oxygen weight content is below 50 ppm.

6. An optical fluoride crystal treatment process according to claim 5, characterized in that said anionic purification leads to a substance wherein metallic contaminant weight content is below 10 ppm, particularly for Zn, Cd, Pb, Na, K, Mn and Fe.

7. An optical fluoride crystal treatment process of preparation of an optical fluoride crystal from a powder of a fluoride of an alkaline metal or of an alkaline earth metal which comprises successively:

an anionic purification of said powder according to the process of claim 3;

the melting of said purified powder;

crystal growing by cooling of said melted purified powder.

8. Process for making a crystal according to claim 7, characterized in that, in said crystal, oxygen weight content is below 50 ppm and in that metallic contaminant weight content is below 10 ppm, particularly for Zn, Cd, Pb, Na, K, Mn and Fe.

9. Process according to claim 8, characterized in that said crystal has an optical 157 nm transmittance greater than 95%/cm.

10. Process of preparation of an optical fluoride crystal for use in <250 nm optical systems, comprising successively:

the consecutive implementation of an anionic purification of said substance in the form of a powder followed by a melting step according to the process according to claim 8 to provide a purified fluoride powder;

the melting of said purified fluoride powder in a crystal growth crucible; and crystal growing by cooling of said melted purified fluoride powder in said crystal growth crucible.

11. An optical fluoride crystal treatment process according to claim 1, characterized in that said powder is made from grains whose mean equivalent diameter is comprised between 10 and 500 μm.

12. An optical fluoride crystal treatment process according to claim 1, said process farther comprising a melting step of a substance in the form of a fluoride powder, characterized in that said treatment step is constituted by the process according to claim 1, and in that said melting step is begun after the distribution means, which are still supplied, are progressively disconnected of said supply source of a gas containing said reactive gas for the implementing of the treatment and are at the same time progressively connected to another supply source of another gas, and after activation of heating means for bringing and maintaining the internal volume of said enclosure at a temperature higher or equal to the melting temperature of said substance.

13. Use of the process according to claim 12 for the manufacture of <250 nm optical fluoride crystals.

14. Use of the process according to claim 12 for the manufacture of feedstock for formation of <250 nm optical fluoride crystals, characterized in that said melting step leads to an optical fluoride crystal feedstock comprised of a compacted powder substance having a density greater than 60% of the theoretical single optical fluoride crystal density.

15. Use according to claim 14, characterized in that oxygen weight content in said feedstock is below 50 ppm.

16. Use according to claim 14, characterized in that metallic contaminant weight content in said feedstock is below 10 ppm, particularly for Zn, Cd, Pb, Na, K, Mn and Fe.

17. Process of preparation of a <250 nm wavelength optical fluoride crystal for use in <250 nm optical systems, comprising successively:

the consecutive implementation of an anionic purification of said powder substance followed by a melting step according to the process of claim 12 to provide a purified compacted fluoride powder;

the melting of said purified compacted fluoride powder in a crystal growth crucible; and crystal growing by cooling of said melted purified compacted fluoride powder in said crystal growth crucible.

18. Process of preparation of an optical fluoride crystal, comprising successively:

the treatment of said substance in the form of a powder according to the process of claim 1 to provide a treated powder;

the melting of said treated powder in a crystal growth crucible; and crystal growing by cooling of said treated powder in said crystal growth crucible.

19. An optical fluoride crystal device for treating and purifying a fluoride crystal substance in the form of a powder by gas film levitation, said gas containing a reactive gas, said device comprising:

an enclosure separating said device from its outside environment, heating means far bringing and maintaining the internal volume of said enclosure to a treatment/purification temperature in the range of 100–1400° C., at least a hollow platform delimiting an internal chamber the top wall of which bears at least two independent diffusers, each diffuser delimiting a cavity able to receive a unitary quantity of said substance, said diffusers being manufactured in a gas permeable material so that each of said cavities communicates with said internal chamber of the corresponding platform, a supply source of a gas containing said reactive gas, and distribution means of said gas containing said reactive gas from said supply source to the inside of the internal chamber of each platform and which has regulating means of the pressure of said distributed gas;

wherein the treatment/purification temperature is below the melting point of the powder.

20. The device according to claim 19, characterized in that each platform comprises at least four diffusers.

21. The device according to claim 19, characterized in that it comprises at least two platforms stacked one above the other, each platform being linked to independent distribution means.

22. The device according to claim 19, characterized in that each cavity is able to receive about 100 to 200 g of said substance.

23. The device according to claim 19, characterized iii that said diffuser is made in a porous material having a permeability comprised between 0.1 and 15 $cm^2/s$.

24. The device according to claim 23, characterized in that said porous material belongs to the group constituted by graphite, alumina, ceramics and porous metals.

* * * * *